United States Patent
Kimura et al.

(10) Patent No.: US 9,653,369 B2
(45) Date of Patent: May 16, 2017

(54) POWER SEMICONDUCTOR MODULE COMPRISING A CASE, BASE PLATE, AND SPACER

(71) Applicant: Mitsubishi Electric Corporation, Tokyo (JP)

(72) Inventors: Yoshitaka Kimura, Tokyo (JP); Rei Yoneyama, Tokyo (JP); Ryo Goto, Tokyo (JP); Akihiko Yamashita, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/010,114

(22) Filed: Jan. 29, 2016

(65) Prior Publication Data

US 2016/0307817 A1    Oct. 20, 2016

(30) Foreign Application Priority Data

Apr. 16, 2015  (JP) .................................. 2015-083862

(51) Int. Cl.
| | |
|---|---|
| *H01L 23/12* | (2006.01) |
| *H01L 23/049* | (2006.01) |
| *H01L 23/10* | (2006.01) |
| *H01L 23/36* | (2006.01) |
| *H01L 23/373* | (2006.01) |

(52) U.S. Cl.
CPC ............ *H01L 23/049* (2013.01); *H01L 23/10* (2013.01); *H01L 23/36* (2013.01); *H01L 23/3735* (2013.01); *H01L 2224/48139* (2013.01)

(58) Field of Classification Search
CPC . H01L 2224/48247; H01L 2224/73265; H01L 23/367; H01L 23/3675; H01L 23/049; H01L 23/4006; H01L 23/492; H01L 23/053
See application file for complete search history.

(56) References Cited

U.S. PATENT DOCUMENTS

| | | | |
|---|---|---|---|
| 2007/0128835 A1* | 6/2007 | Yang | ...................... H01L 21/561 438/464 |
| 2008/0164413 A1* | 7/2008 | Shibayama | ............... G01J 5/04 250/338.4 |
| 2008/0217760 A1* | 9/2008 | Yoshihara | ............... H01L 23/36 257/693 |

(Continued)

FOREIGN PATENT DOCUMENTS

JP          06-188363          7/1994

*Primary Examiner* — Khiem D Nguyen
(74) *Attorney, Agent, or Firm* — Studebaker & Brackett PC

(57) ABSTRACT

It is an object to provide a power semiconductor module having a case shared for base plates of different sizes and having a high-stability base plate. The power semiconductor module according to the present invention includes: a base plate; an insulating substrate disposed on a first main surface of the base plate; a semiconductor chip disposed on an insulating substrate; a case for enclosing the base plate except a second main surface of the base plate facing the first main surface, the insulating substrate, and the semiconductor chip; and a spacer provided between the outer periphery of the base plate and the inner periphery of the case and in contact with both. The spacer has a bonding surface with a side surface of the base plate and the first main surface in the contact with the outer periphery of the base plate.

5 Claims, 3 Drawing Sheets

(56) References Cited

U.S. PATENT DOCUMENTS

| | | | |
|---|---|---|---|
| 2013/0176761 A1* | 7/2013 | Hattori | B60L 11/14 363/131 |
| 2014/0124962 A1* | 5/2014 | Scheid | H01L 24/92 257/783 |
| 2014/0167242 A1* | 6/2014 | Kim | H01L 23/053 257/690 |

* cited by examiner

POWER SEMICONDUCTOR MODULE COMPRISING A CASE, BASE PLATE, AND SPACER

BACKGROUND OF THE INVENTION

Field of the Invention

The present invention relates to a technique for case sharing of a power semiconductor module.

Description of the Background Art

Power Semiconductor modules include base plates, insulating substrates on the base plates, semiconductor chips on the insulating substrates, and cases that accommodate them.

Semiconductor chips have different mounting areas depending on their different current capacities. That is, semiconductor chips with large current capacities have large mounting areas, and semiconductor chips with small current capacities have small mounting areas. Moreover, the base plates serve to dissipate heat generated from the semiconductor chips. Accordingly, in the power semiconductor modules that use the semiconductor chips with the small current capacities and small mounting areas, it is possible to reduce the areas of the base plates as well in terms of heat dissipation capability. This reduces materials for the base plates.

Unfortunately, changing the sizes of the cases in conformance with the areas of the base plates increases kinds of cases, thus resulting in decreased productivity of the cases.

Accordingly, to use cases (packages) of a uniform size for base plates of various sizes, proposed is a method for disposing spacers between the base plates and the cases (For instance, Japanese Patent Application Laid-Open No. 06-188363).

In a power semiconductor module in Japanese Patent Application Laid-Open No. 06-188363, a side surface of a base plate and a side surface of a spacer are bonded with an adhesive. Hence, the bond strength thereof is disadvantageously week.

SUMMARY OF THE INVENTION

It is an object of the present invention to provide a power semiconductor module having a case shared for base plates of different sizes and having a high-stability base plate.

The power semiconductor module according to the present invention includes a base plate, an insulating substrate, a semiconductor chip, a case, and a spacer. The insulating substrate is disposed on a first main surface of the base plate. The semiconductor chip is disposed on the insulating substrate. The case encloses the base plate except a second main surface of the base plate facing the first main surface, the insulating substrate, and the semiconductor chip. The spacer is provided between an outer periphery of the base plate and an inner periphery of the case and in contact with both. The spacer has a bonding surface with a side surface of the base plate and the first main surface in the contact with the outer periphery of the base plate.

The spacer of the power semiconductor module according to the present invention has the bonding surface with the side surface and first main surface of the base plate in the contact with the outer periphery of the base plate. This boosts the bond strength thereof as compared to if the spacer was bonded only to the side surface of the base plate.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Comparative Example

Figure 1:
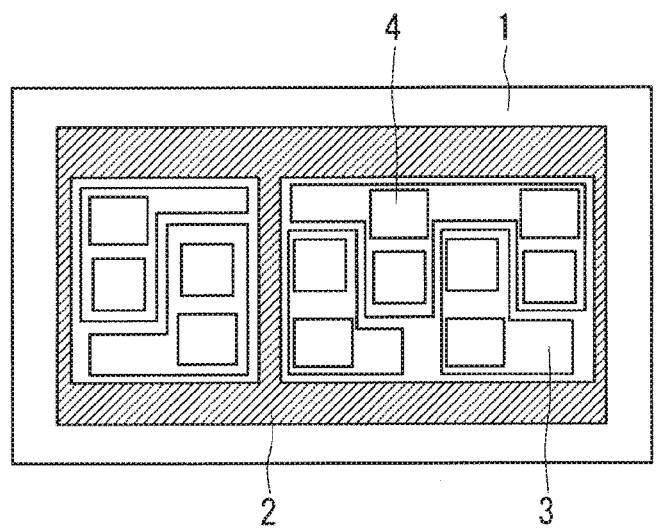
FIG. 1 is a top view of a power semiconductor module according to a comparative example.
Figure 2:
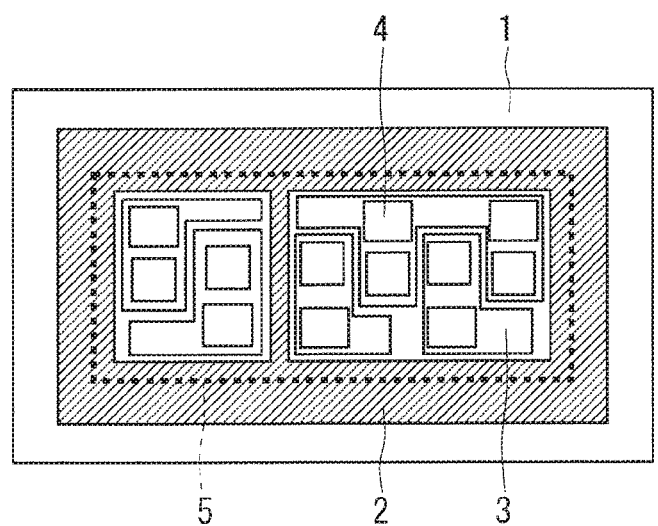
FIG. 2 is a top view of a power semiconductor module according to a comparative example.

FIGS. 1 and 2 are respectively top views of power semiconductor modules according to comparative examples 1 and 2 to the present invention. Each power semiconductor module includes: a base plate 2; insulating substrates 3 disposed on the base plate 2; semiconductor chips 4 disposed on the insulating substrates 3; and a case 1 for enclosing the base plate 2, the insulating substrates 3, and the semiconductor chips 4.

The semiconductor chip of the power semiconductor module shown in FIG. 2 has a smaller current capacity than that of the semiconductor chip shown in FIG. 1, and thus has a smaller area. Despite such a fact, using the case 1 and base plate 2 same as those in the power semiconductor module shown in FIG. 1 produces a redundant region in the base plate 2 where the semiconductor chips 4 are not mounted. In the base plate 2 shown in FIG. 2, a region outside a dotted-lined frame 5 is such a redundant region.

B. First Preferred Embodiment

<B-1. Configuration>

Reducing the area of a base plate 2 in conformance with mounting areas of semiconductor chips 4 can eliminate a redundant region of the base plate 2 and reduce materials.

Further, disposing a spacer in a space resulting from a reduction in the area of the base plate 2 can manufacture a power semiconductor module using a case 1 of a uniform size for the base plate 2 of various sizes.

Accordingly, in a first preferred embodiment of the present invention, it is possible to manufacture the power semiconductor module using the case 1 of the uniform size for the base plate 2 of the various sizes by reducing the area of the base plate 2, depending on current capacities of the semiconductor chips 4 and by disposing a spacer 6 in the space resulting from the reduction.

Figure 3:
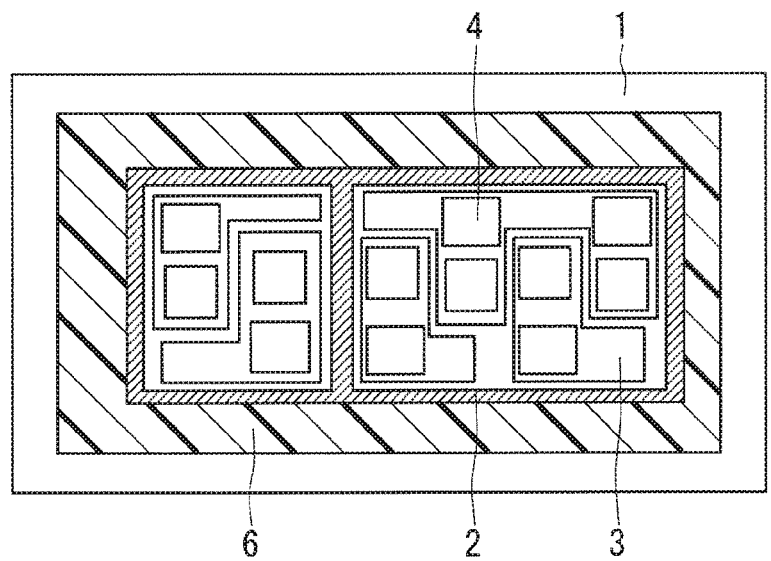
FIG. 3 is a top view of a power semiconductor module according to a first preferred embodiment.
Figure 4:
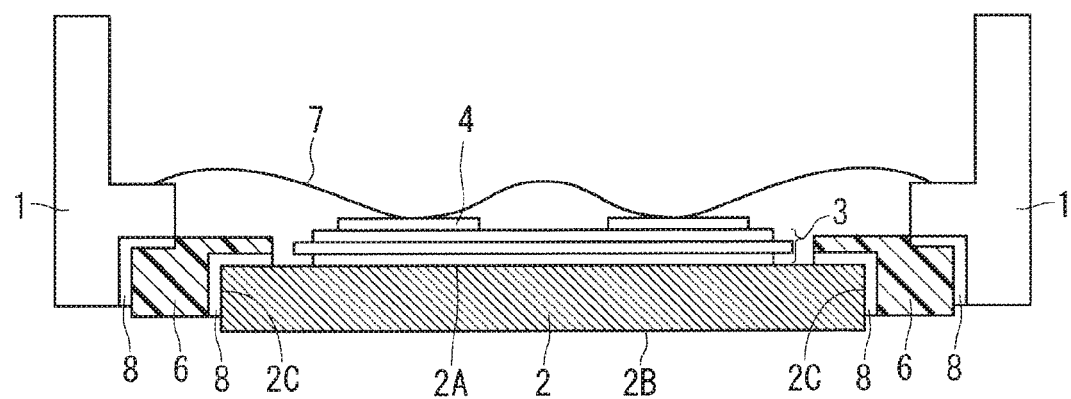
FIG. 4 is a cross-sectional view of the power semiconductor module according to the first preferred embodiment.

FIG. 3 is a top view of the power semiconductor module according to the first preferred embodiment, and FIG. 4 is a cross-sectional view of the same. The power semiconductor module according to the first preferred embodiment includes: the base plate 2; insulating substrates 3 disposed on a first main surface 2A of the base plate 2; the semiconductor chips 4 disposed on the insulating substrates 3; the case 1 for enclosing the base plate 2 except a second main surface 2B facing the first main surface 2A of the base plate 2, the insulating substrates 3, and the semiconductor chips 4; and a spacer 6 provided between the outer periphery of the base plate 2 and the inner periphery of the case 1 and in contact with both.

Providing the spacer 6 allows the power semiconductor module to be manufactured using the case 1 of a large size for the base plate 2. It is thus possible to use the case 1 of the uniform size for the base plate 2 of the various sizes. This boosts productivity of the case 1 while reducing materials for the base plate 2.

As shown in FIG. 4, the spacer 6 has a shape to hang on the case 1 and base plate 2. In other words, the spacer 6 has a contact surface with a side surface 2C and first main surface 2A with respect to the base plate 2, and also has a contact surface having two or more surfaces with respect to the case 1. Moreover, the spacer 6 is bonded to the case 1 and base plate 2 in the contact surfaces with an adhesive 8. In this way, the spacer 6, which is bonded to the first main surface 2A as well as to the side surface 2C with respect to the base plate 2, has a great bond strength between the spacer 6 and the base plate 2 as compared to if the spacer 6 was bonded only to the side surface 2C of the base plate 2. Further, the spacer 6, which is in contact with the case 1 in the two or more surfaces as well, also has a great bond strength between the spacer 6 and the case 1.

A circuit may be formed on the spacer 6, which is not shown in FIG. 4. When the circuit is not formed on the spacer 6, however, the size of the spacer 6 is not limited by the size of a circuit substrate. This advantageously allows a flexible change in the size of the spacer 6 depending on the size of the base plate 2.

<B-2. Spacer>

One example of materials used for the spacer 6 is resin. However, a resin having a large linear expansion coefficient, if used to surround the base plate 2, may cause warpage in the module due to expansion or contraction of the resin caused by a change in temperature.

In contrast to this, a material having a linear expansion coefficient smaller than that of resin, such as ceramic, if used for the spacer 6, can reduce the warpage in the module.

Further, rubber, if used for the spacer 6, can adhere the power semiconductor module, when fixed to a cooling fin, to the cooling fin thanks to the elasticity of a rubber material in the warpage occurring in the module due to thermal hysteresis. This reduces deterioration of a contact thermal resistance.

Still further, a porous material for the spacer 6, which is lighter than the resin, can make the power semiconductor module light.

<B-3. Effect>

The power semiconductor module according to the first preferred embodiment includes: the base plate 2; the insulating substrates 3 formed on the first main surface 2A of the base plate 2; the semiconductor chips 4 formed on the insulating substrates 3; the case 1 for enclosing the base plate 2 except the second main surface 2B facing the first main surface 2A of the base plate 2, the insulating substrates 3, and the semiconductor chips 4; and the spacer 6 provided between the side surface 2C of the base plate 2 and the case 1 and in contact with both. The spacer 6 has the bonding surface with the side surface 2C and first main surface 2A of the base plate 2. This boosts the bond strength between the spacer 6 and the base plate 2 as compared to if the spacer 6 was bonded only to the side surface 2C of the base plate 2.

Further, the spacer 6, which is bonded to the base plate 2 with the adhesive 8 in the aforementioned bonding surface, is bonded to the base plate 2 with a great strength.

Still further, the spacer 6 is bonded to the case 1 in two or more surfaces, thus boosting the bond strength between the spacer 6 and the case 1 as compared to if the spacer 6 was bonded only in one surface.

Yet further, when the spacer 6 is made of ceramic, which has the linear expansion coefficient smaller than that of the resin, the warpage in the power semiconductor module due to the change in temperature can be reduced.

Still yet further, when the spacer is made of rubber, the power semiconductor module, when fixed to a cooling fin, can adhere to the cooling fin thanks to the elasticity of the rubber material in the warpage occurring in the power semiconductor module due to the thermal hysteresis. This reduces the deterioration of the contact thermal resistance.

Still yet further, when the spacer 6 is made of the porous material, the power semiconductor module can be lightened.

C. Second Preferred Embodiment

<C-1. Configuration>

Figure 5:
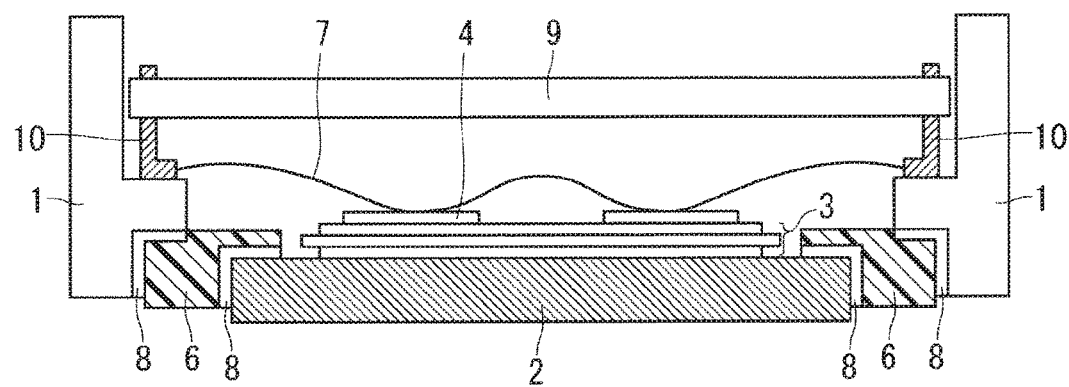
FIG. 5 is a cross-sectional view of a power semiconductor module according to a second preferred embodiment.

FIG. 5 is a cross-sectional view of a power semiconductor module according to a second preferred embodiment. The power semiconductor module according to the second preferred embodiment is an intelligent power module (IPM), and includes electrodes 10 and a control substrate 9 in addition to the configuration of the power semiconductor module according to the first preferred embodiment. The electrodes 10 are bonded to semiconductor chips 4 through a wire 7, and the control substrate 9 is electrically connected to the electrodes 10.

The control substrate 9 has a control circuit, such as a drive circuit of the semiconductor chip 4, mounted therein. The control substrate 9 is provided above the semiconductor chip 4 within the case 1, and the power semiconductor module according to the second preferred embodiment is the IPM of a "two-story structure".

In this way, providing the control substrate 9 above the semiconductor chips 4 eliminates the need for providing the control substrate 9 on the upper surface of a spacer 6. The size of the spacer 6 can be thus freely chosen without being affected by a mounting area of the control circuit. This allows optimization in the area of the base plate 2 in view of heat dissipation capability and costs, and further allows determination in the size of the spacer 6 depending on the area of the base plate 2 and on the size of the case 1.

<C-2. Effect>

The power semiconductor module according to the second preferred embodiment further includes the control substrate 9 of the semiconductor chip 4 above the semiconductor chips 4 within the case 1. The size of the spacer 6 can be thus freely chosen without being affected by the mounting area of the control circuit.

D. Third Preferred Embodiment

<D-1. Configuration>

Figure 6:
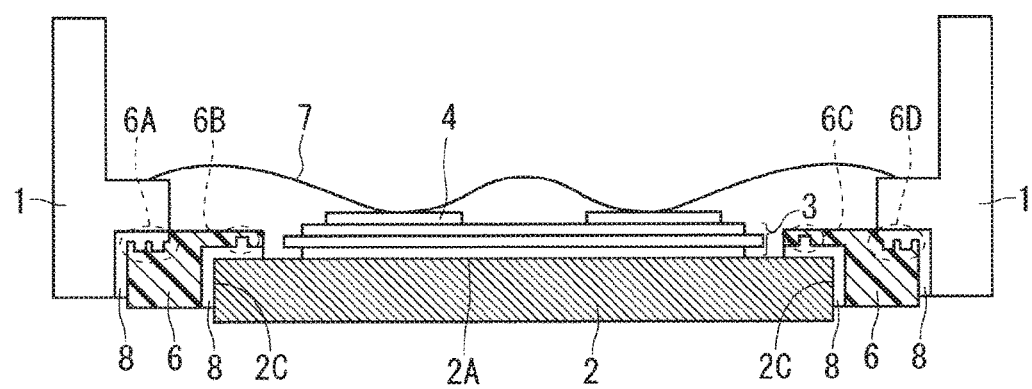
FIG. 6 is a cross-sectional view of a power semiconductor module according to a third preferred embodiment.

FIG. 6 is a cross-sectional view of a power semiconductor module according to a third preferred embodiment. The power semiconductor module according to the third preferred embodiment is similar to that according to the first preferred embodiment except that a bonding surface of a spacer 6 with a case 1 and base plate 2 has an uneven shape. In FIGS. 6, 6A, 6B, 6C, and 6D denote respective uneven locations in the bonding surface of the spacer 6.

According to such a configuration, an adhesive 8 forms the uneven locations in the bonding surface of the spacer 6 thus to enter the uneven locations. Accordingly, adhesive areas increase. This boosts the adhesion between the spacer 6, and the base plate 2 and case 1.

Note that in FIG. 6, the uneven locations are formed only in the bonding surface in a horizontal direction (side-to-side direction in FIG. 6) of the spacer 6, but the uneven locations may be formed in a bonding surface in a vertical direction (up-and-down direction in FIG. 6) including a bonding surface with a side surface 2C of the base plate 2, for instance. When the uneven locations are formed in at least one surface of the bonding surface of the spacer 6 with the base plate 2, the bond strength between the spacer 6 and the base plate 2 is advantageously boosted.

<D-2. Effect>

In the power semiconductor module according to the third preferred embodiment, the spacer 6 has the uneven shape in at least one surface of the bonding surface with the base plate 2. Accordingly, the adhesive 8 enters the uneven locations to increase adhesive areas, thus boosting the adhesion between the spacer 6 and the base plate 2.

E. Fourth Preferred Embodiment

<E-1. Configuration>

Figure 7:
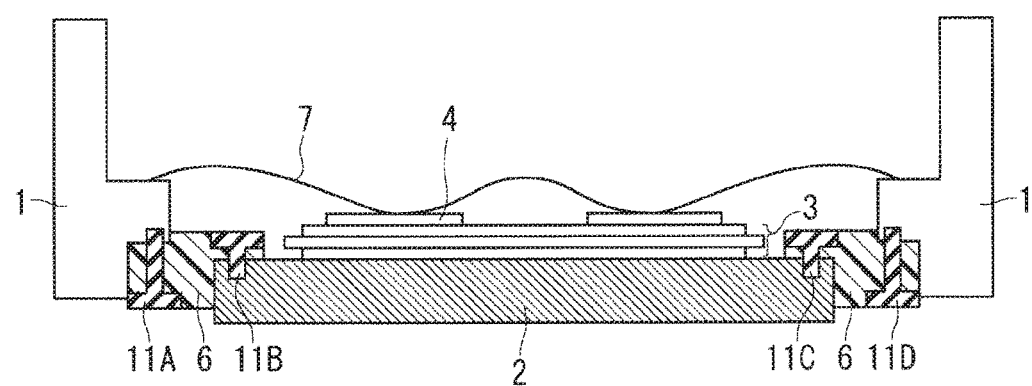
FIG. 7 is a cross-sectional view of a power semiconductor module according to a fourth preferred embodiment.

FIG. 7 is a cross-sectional view of a power semiconductor module according to a fourth preferred embodiment. In each of the power semiconductor modules according to the first to third preferred embodiments, the spacer 6 is bonded to the case 1 and base plate 2 with the adhesive 8, but in the power semiconductor module according to the fourth preferred embodiment, screws 11A, 11B, 11C, and 11D are used to join them. Other than this, the configuration of the power semiconductor module according to the fourth preferred embodiment is similar to that according to the first preferred embodiment.

The heads of the screws 11A, 11B, 11C and 11D are preferably thin. Further, a large current may flow near a base plate 2, and thus the screws 11B and 11C for joining a spacer 6 and the base plate 2 are desirably insulating screws.

Joining with the screws allows the spacer 6 to be firmly fixed to the base plate 2 and a case 1 as compared to bonding with an adhesive 8.

Note that in FIG. 7, the spacer 6 is joined to both case 1 and base plate 2 with the screws, but the spacer 6 may be joined to the base plate 2 with screws and bonded to the case 1 with an adhesive. In such a case, the bond strength between the spacer 6 and the base plate 2 can be boosted.

<E-2. Effect>

In the power semiconductor module according to the fourth preferred embodiment, the spacer 6 is joined to the base plate 2 with the insulating screws 11B and 11C in a bonding surface with the base plate 2. This allows the spacer 6 to be firmly fixed to the base plate 2 as compared to if the spacer 6 was bonded with the adhesive 8. Additionally, an insulation property can be increased.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor module comprising:
   a base plate;
   an insulating substrate only partially covering a first main surface of said base plate;
   a semiconductor chip disposed on said insulating substrate;
   a case for enclosing said base plate except a second main surface of said base plate facing said first main surface, said insulating substrate, and said semiconductor chip; and
   a spacer provided between an outer periphery of said base plate and an inner periphery of said case and in contact with both, wherein
   said spacer includes a bonding surface in contact with a side surface of said base plate and said first main surface of said base plate at said outer periphery of said base plate, and
   said spacer is bonded to said base plate with an adhesive in said bonding surface.

2. The power semiconductor module according to claim 1, wherein said spacer has an uneven shape in at least one surface of said bonding surface.

3. The power semiconductor module according to claim 1, further comprising a control substrate of said semiconductor chip above said semiconductor chip within said case.

4. The power semiconductor module according to claim 1, wherein
   said spacer is bonded to said case in two or more surfaces.

5. A power semiconductor module comprising:
   a base plate;
   an insulating substrate only partially covering a first main surface of said base plate;
   a semiconductor chip disposed on said insulating substrate;
   a case for enclosing said base plate except a second main surface of said base plate facing said first main surface, said insulating substrate, and said semiconductor chip; and
   a spacer provided between an outer periphery of said base plate and an inner periphery of said case and in contact with both, wherein
   said spacer includes a bonding surface in contact with a side surface of said base plate and said first main surface of said base plate at said outer periphery of said base plate, and
   said spacer is joined to said base plate with an insulating screw in said bonding surface.

\* \* \* \* \*